United States Patent
Male (10) Patent No.: US 7,595,644 B2
(45) Date of Patent: Sep. 29, 2009

(54) POWER-OVER-ETHERNET ISOLATION LOSS DETECTOR

(75) Inventor: Barry J. Male, West Granby, TX (US)

(73) Assignee: Texas Instruments Incorporated, Dallas, TX (US)

( * ) Notice: Subject to any disclaimer, the term of this patent is extended or adjusted under 35 U.S.C. 154(b) by 258 days.

(21) Appl. No.: 11/838,451

(22) Filed: Aug. 14, 2007

(65) Prior Publication Data

US 2009/0045818 A1 Feb. 19, 2009

(51) Int. Cl.
*G01R 31/14* (2006.01)

(52) U.S. Cl. .................. 324/509; 324/544; 324/551; 712/32; 370/225; 370/242; 370/248

(58) Field of Classification Search .......... 324/509, 324/541, 544, 551; 361/42
See application file for complete search history.

(56) References Cited

U.S. PATENT DOCUMENTS

| | | | | |
|---|---|---|---|---|
| 5,132,629 A | * | 7/1992 | Clinton et al. | 324/544 |
| 5,448,176 A | * | 9/1995 | Mashikian et al. | 324/551 |
| 5,471,144 A | * | 11/1995 | Meyer | 324/551 |
| 5,696,777 A | * | 12/1997 | Hofsaess | 714/820 |
| 6,529,392 B2 | | 3/2003 | Nishida et al. | |
| 6,563,718 B1 | | 5/2003 | Li et al. | |
| 6,611,148 B2 | * | 8/2003 | Clinton | 324/544 |
| 6,813,125 B1 | * | 11/2004 | Ballard et al. | 361/42 |
| 6,940,733 B2 | | 9/2005 | Schie et al. | |
| 7,030,621 B2 | * | 4/2006 | Sarkozi et al. | 324/536 |
| 2006/0268898 A1 | * | 11/2006 | Karam | 370/401 |
| 2007/0011547 A1 | * | 1/2007 | Karam | 714/746 |
| 2008/0084200 A1 | * | 4/2008 | Kojori | 324/117 H |

FOREIGN PATENT DOCUMENTS

WO WO2004038900 5/2004

\* cited by examiner

*Primary Examiner*—Timothy J Dole
*Assistant Examiner*—Benjamin M Baldridge
(74) *Attorney, Agent, or Firm*—John J. Patti; Wade J. Brady, III; Frederick J. Telecky, Jr.

(57) ABSTRACT

An AC generator has a first terminal coupled through an Isolation Loss Detect (ILD) capacitor to the positive bus of a Power-Over-Ethernet (POE) system, and has a second terminal coupled through the primary of a transformer to earth ground. AC current flowing between ground and the positive bus causes a corresponding AC voltage across the secondary of this transformer. The secondary of the transformer is coupled to an AC detector, whose output is coupled to a comparator. The threshold of the comparator is set such that when AC current through the ILD capacitor exceeds a threshold value, an ISOLATION FAULT output is generated by the comparator.

14 Claims, 4 Drawing Sheets

POWER-OVER-ETHERNET ISOLATION LOSS DETECTOR

BACKGROUND OF THE INVENTION

1. Field of the Invention

This invention relates generally to digital communications systems, and more specifically to such systems that provide electrical power over digital data conductors in such systems, and more specifically to monitoring isolation between conductors in such systems and earth ground.

2. Description of the Related Art

Digital data communications systems can be made capable of delivering power over the same conductors that communicate the digital data. For example, the IEEE 802.3af Power-Over-Ethernet (POE) standard defines a way of delivering DC power in an Ethernet network that provides 10/100/1000 Mbps data communication. A POE link allows a Powered Device to draw up to approximately 13 W from Power Sourcing Equipment. A POE link requires high electrical isolation between conductors of the POE system and earth ground. This isolation requirement in 802.3af systems is vital to prevent life threatening conditions related to electrocution or fire hazards at an installation. Validation of a POE systems isolation conformance over the life of an installation becomes a significant issue. Maintenance of such conformance is presently a long term commitment to manual continuity verification by the user.

Briefly, a POE system is comprised of Power Source Equipment (PSE), cabling infrastructure, midpoint devices, patch panels, and end Powered Devices (PD). Loss of isolation to earth ground at any of these points will compromise total system isolation. There are a multitude of events that could cause the loss of isolation at each of these system points. It is possible that an installation may actually be installed with partial or no electrical isolation between its floating 48V system and earth ground. In most cases, a system still continues to function with an isolation loss. Erroneous manual verification in such systems could easily result in long-term, sustained isolation loss.

When a system has lost isolation, a secondary event anywhere in that system can result in an electrocution hazard in some cases a fire hazard.

The isolation requirement of the PSE 48V circuit precludes the use of many known circuits for measuring DC leakage, since such measurement itself may bring the system leakage out of specification compliance. As POE becomes embedded in LAN switches and thus finds widespread usage, the probability of life threatening events increases. Additionally, the power and/or voltage available to each PD is also increasing, from the standard 15 W to 30 W, further increasing the danger of isolation loss.

An apparatus and method for measuring isolation loss in a digital communications system that also provides power, such as a POE system, without the measurement circuitry or method significantly degrading isolation, is therefore desirable.

SUMMARY OF THE INVENTION

The invention provides a method and apparatus for measuring and monitoring the electrical isolation from many points in a digital communications system that also provides power, such as a POE system to earth ground, while retaining the high level of galvanic isolation specified for such systems.

In an embodiment of the invention described in greater detail below, an alternating current of controlled frequency and amplitude is coupled from a first terminal of an AC generator through an Isolation Loss Detection (ILD) capacitor to the positive bus in a POE system. The second terminal of the AC generator is coupled through the primary of a transformer to earth ground. When high isolation exists between the conductors of the POE system and earth ground, little or no AC current flows through the series-connected ILD capacitor, AC generator, and transformer. When a loss of isolation occurs between a conductor of the POE system and earth ground, the resulting change in impedance from the positive bus to earth ground causes a significant increase in the AC current flowing through the ILD capacitor, AC generator, and transformer. The voltage generated on the load resistor across the secondary of the transformer by current flow in the primary is detected and coupled to a comparator. By measuring this AC voltage and comparing it to an appropriate threshold value, the loss of isolation is detected. Because the impedance of the voltage supply—typically a battery—is very low at the AC generator frequency, a loss of isolation between earth ground and conductors coupled either to the positive or negative buses of the POE system may be monitored.

In some POE systems, bypass capacitors are coupled between the positive and/or negative buses and earth ground, typically to control electromagnetic interference (EMI). This distributed capacitance, which is effectively in series with the ILD capacitor, causes a nominal AC current of Iac to flow under normal conditions of little or no isolation loss. The appropriate threshold value for the comparator mentioned above is thus somewhat above this nominal Iac. By adding a second comparator with a threshold somewhat below the nominal Iac, operation of the AC generator may be confirmed, by determining that the AC current is present. For example, if the distributed bypass capacitance and the ILD capacitance are approximately equal, in normal conditions a current Iac will flow through the ILD capacitor. In the presence of an isolation loss such as a short to earth ground from a POE conductor, the distributed bypass capacitance is paralleled by this short to earth ground, causing the series AC impedance to approximately be halved, thus approximately doubling to 2*Iac the AC current flowing in the ILD capacitor.

A preferred embodiment of the invention measures the amplitude of the AC current in the ILD capacitor by low-pass filtering and synchronously rectifying the AC signal present at the secondary of the transformer, to generate a DC voltage responsive to the AC current level. This filtering and synchronous rectification rejects interfering AC signals, such as the 60 Hz power line frequency, by integrating the output of the synchronous rectifier over a number of cycles of the primary interference frequency. For example, in a preferred embodiment using a 480 Hz measuring signal, sixteen half-cycles of the synchronous rectifier output are integrated over one cycle of the 60 Hz interference frequency.

Another embodiment is useful in a POE system having bypass capacitors from conductors to earth ground, which cause a nominal AC current to flow in the ILD capacitor even with no isolation loss. A second threshold is added which is somewhat below this nominal ILD capacitor current, to provide self-test of operation of the isolation loss detector. A failure in the oscillator or rectifier circuitry causes the ILD capacitor current or the rectified voltage, respectively, to fall below this second threshold, indicating a failure in the monitoring circuitry.

Another embodiment uses an alternative AC detector mechanism.

Yet another embodiment measures the AC voltage at the side of the ILD capacitor coupled to the positive bus, and directly measures a drop in this voltage when an isolation loss occurs.

Still another embodiment couples the primary of a transformer through an ILD capacitor to the POE buses, thus reflecting the impedance across its primary to the transformer secondary. This impedance across the secondary is thus relatively high in the case of high isolation between POE conductors, and relatively lower in the case of isolation loss. An AC current is applied through a series connection of AC generator, sense resistor, and transformer secondary. The AC voltage across the sense resistor is thus responsive to the secondary impedance and therefore also to the isolation between POE conductors, and is detected and compared to a threshold to signal isolation loss.

A significant advantage of the described embodiments is the ability to detect loss of isolation between many points in a digital communications system that also provides power, such as a POE system and earth ground, while retaining high galvanic isolation between these same points and earth ground. Another significant advantage is the ability to sense failure of the isolation loss detector circuitry.

Further benefits and advantages will become apparent to those skilled in the art to which invention relates.

DESCRIPTION OF THE VIEWS OF THE DRAWINGS

Throughout the drawings, like elements are referred to by like numerals.

DETAILED DESCRIPTION

Figure 1:
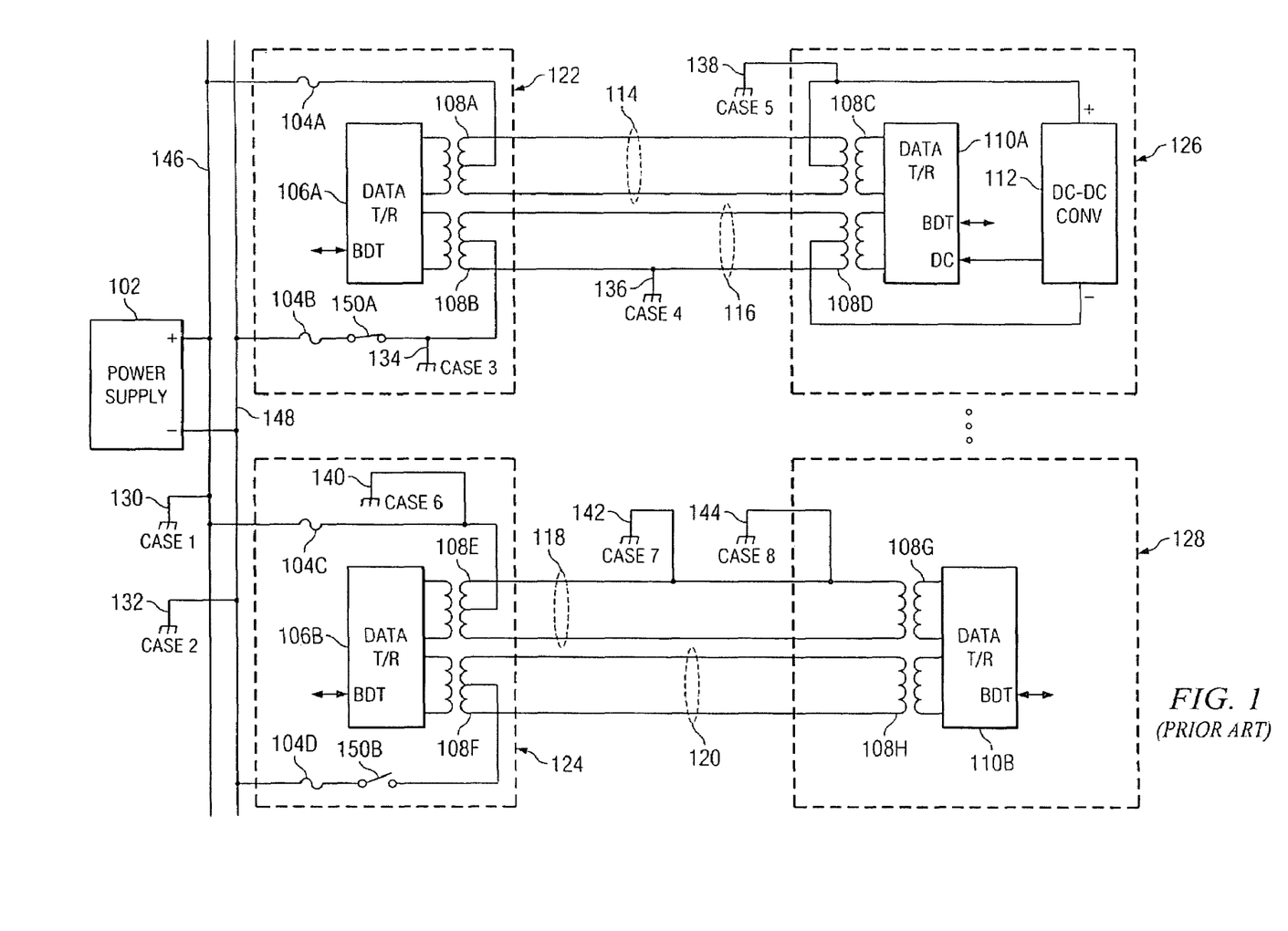
FIG. 1 (prior art) shows a generic POE system and representative cases of isolation loss between POE conductors and earth ground.

In FIG. 1, a prior art representative POE system comprises a POWER SUPPLY 102 having a positive output coupled to a positive bus 146 and a negative output coupled to negative bus 148. A first PSE module 122 has a first terminal of fuse 104A coupled to the positive bus, and a second terminal of fuse 104A coupled to the center tap of the secondary of transformer 108A. A first terminal of fuse 104B is coupled to the negative bus, and the second terminal of fuse 104B is coupled to the first terminal of switch 150A. The second terminal of switch 150A is coupled to the center tap of the secondary of transformer 108B. A first terminal of the primary of transformer 108A is coupled to a first terminal of a data transmit/receive unit, DATA T/R 106A, while a second terminal of the primary of transformer 108A is coupled to a second terminal of DATA T/R 106A. A first terminal of the secondary of transformer 108A is coupled to a first wire in wire pair 114, while a second terminal of the secondary of transformer 108A is coupled to a second wire in wire pair 114. A first terminal of the primary of transformer 108B is coupled to a third terminal of DATA T/R 106A, while a second terminal of the primary of transformer 108B is coupled to a fourth terminal of DATA T/R 106A. A first terminal of the secondary of transformer 108B is coupled to a first wire in wire pair 116, while a second terminal of the secondary of transformer 108B is coupled to a second wire in wire pair 116. A bidirectional data signal is coupled to a fifth bidirectional data terminal (BDT) of DATA T/R 106A.

A first terminal of the primary of transformer 108C is coupled to a first terminal of a second data transmit/receive unit, DATA T/R 110A, while a second terminal of the primary of transformer 108C is coupled to a second terminal of DATA T/R 110A. A first terminal of the secondary of transformer 108C is coupled to a first wire in wire pair 114, while a second terminal of the secondary of transformer 108C is coupled to a second wire in wire pair 114. A first terminal of the primary of transformer 108D is coupled to a third terminal of DATA T/R 110A, while a second terminal of the primary of transformer 108D is coupled to a fourth terminal of DATA T/R 110A. A first terminal of the secondary of transformer 108D is coupled to a first wire in wire pair 116, while a second terminal of the secondary of transformer 108D is coupled to a second wire in wire pair 116. The center tap of the secondary of transformer 108D is coupled to a second (negative) terminal of DC-DC CONV 112, while the center tap of the secondary of transformer 108C is coupled to a first (positive) terminal of DC-DC CONV 112. A third terminal of DC-DC CONV 112 is coupled to a fifth terminal of DATA T/R 110A. A bidirectional data signal is coupled to a fifth bidirectional data terminal (BDT) of DATA T/R 110A.

Another PSE 124 has a topology substantially equivalent to PSE 122, but coupled to wire pair 118 and wire pair 120. Also coupled to wire pairs 118 and 120 is non-powered terminal device 128, comprising DATA T/R 110B coupled to wire pairs 118 and 120 by transformers 108G and 108H, respectively, as described above. Transformers 108G and 108H have no center tap on the secondary, and there is no DC/DC CONV in non-powered terminal device 128.

In operation, data is coupled to the bidirectional data terminal (BDT) of DATA T/R 106 in module 122, and this data is processed and coupled in a known manner by DATA T/R 106 to transformer 108A. Transformer 108A provides galvanic isolation and provides a balanced data signal which is coupled to wire pair 114. Transformer 108C in module 126 couples this balanced data signal from wire pair 114 to DATA T/R 110. The POE positive supply voltage is generated by POWER SUPPLY 102 and coupled to bus 146. The voltage on bus 146 is coupled through fuse 104A to the center tap of transformer 108A, thus applying the positive voltage to both wires of wire pair 114. In a similar manner, the POE negative supply voltage generated by POWER SUPPLY 102 is coupled to bus 148. The voltage on bus 148 is coupled through fuse 104B and closed switch 150A to the center tap of transformer 108B, thus applying the negative voltage to both wires of wire pair 116. In module 126, the positive voltage is coupled from the center tap of transformer 108C to the positive terminal of DC-DC CONV 112, and the negative voltage is coupled from the center tap of transformer 108D to the negative terminal of DC-DC CONV 112. DC-DC CONV 112 then converts this applied voltage to a voltage and current appropriate to power DATA T/R 110.

A second PSE module 124 has switch 150B open, since the module 128 is a non-powered device, or derives its power from sources other than POE. The operation of the data path between module 124 and module 128 is as described above. Current flow from the PSE is precluded by the open position of switch 150B in module 124. This open switch also prevents the negative POE supply voltage from being applied to wire pair 120. However, the positive POE supply voltage is applied to wire pair 118.

In normal operation and with proper installation, the shorts to earth ground represented by SHORT 130, 132, 134, 136, 138, 140, 142, 144 are not present. The presence of one or more of these unintended shorts creates an isolation loss, and each is discussed below. In this document, the term "short" refers to any loss of isolation, including losses having near-zero resistance or impedance (galvanic short) and those with non-zero resistance or impedance.

In Case 1 SHORT 130, the positive bus of the 48V power supply in the PSE is shorted to earth ground. In this case, a person contacting any conductor coupled to the negative bus 148 is at risk of current flow through him to earth ground (shock). Similarly, a second short to earth ground from such a conductor may cause sufficient current to flow so that conductor heating presents a fire hazard. The switch 150 is typically closed for a PD such as module 126, and open for a non-powered terminal such as module 128. This switch, when open, reduces the risk of shock by removing voltage from wire pair 120. Similarly, the fuse 104 reduces the risk of fire by limiting short-circuit current.

In Case 2 SHORT 132, the negative bus of the 48V power supply in the PSE is shorted to earth ground. In this case, a person contacting any conductor coupled to the positive bus 146 is at risk of current flow through him to earth ground (shock). Similarly, a second short to earth ground from such a conductor may cause sufficient current to flow that conductor heating presents a fire hazard. In this case, the open or closed condition of switch 150 has no effect on the shock hazard. Fuse 104 reduces the risk of fire as in Case 1.

In Case 3 SHORT 134, the negative conductor in PSE module 122 on the side of switch 150A away from the negative bus 148 is shorted to earth ground. The resulting risk of shock is substantially the same as that of Case 2 if switch 150A is closed, as it would be with PD 126 present as shown.

In Case 4 SHORT 136, one of the conductors in wire pair 116 is shorted to earth ground. Each of the wires in this pair is at the negative supply voltage. Assuming switch 150A in module 122 is closed as above, the risks are substantially the same as Case 2 and Case 3.

In Case 5 SHORT 138, a conductor in PD module 126 which is coupled to the positive supply voltage is shorted to ground. The risk in this case is substantially the same as Case 1.

In Case 6 SHORT 140, a conductor in PSE module 124 which is coupled to the positive supply voltage is shorted to ground. The risk in this case is substantially the same as Case 1.

In Case 7 SHORT 142, one of the conductors in wire pair 118 is shorted to earth ground. Each of the wires in this pair is at the positive supply voltage. Regardless of the open or closed condition of switch 150B in module 124, the risks are substantially the same as Case 1, Case 5, and Case 6.

In Case 8 SHORT 144, a conductor in non-powered module 128 which is coupled to the positive supply voltage is shorted to ground. The risk in this case is substantially the same as Case 1, Case 5, Case 6, and Case 7.

It is apparent to those skilled in the art that many other isolation loss conditions may occur at various points in the system, and that the risks of shock and fire are similar regardless of where in the system they occur. Normal system operation continues in the presence of a single point isolation loss as described in the above cases, even while the risk of shock or fire is increased.

Figure 2:
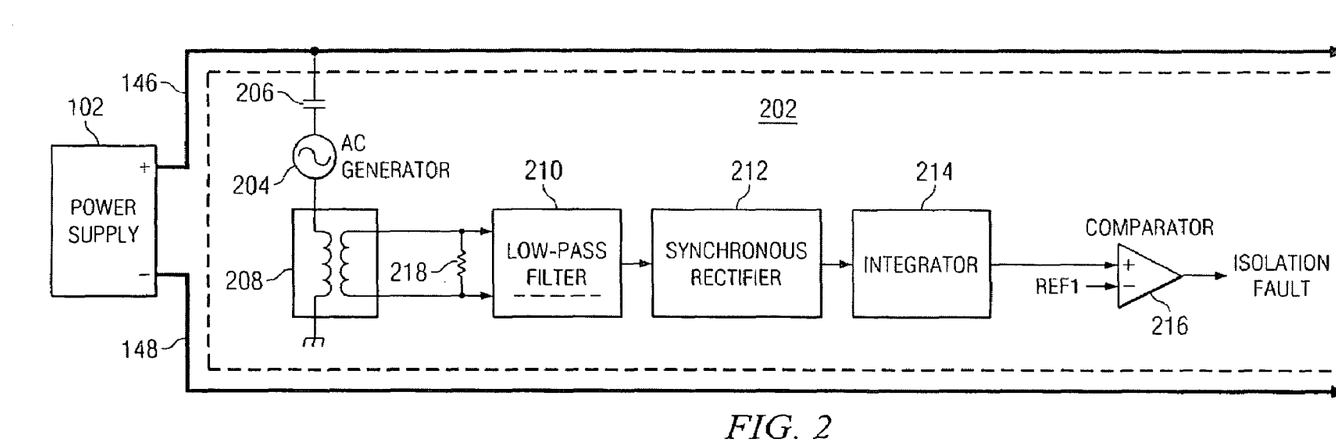
FIG. 2 is a block diagram of an isolation loss detector which injects an AC current into the POE conductors, then measures the amplitude of the AC current flow and compares it to a known threshold, so as to monitor isolation between POE conductors and earth ground.

FIG. 2 is a block diagram of a preferred embodiment of the invention, which detects isolation loss at many points in the POE system. The POE system comprises POWER SUPPLY 102, positive bus 146, and negative bus 148, which are coupled in a known manner to the known POE system shown in FIG. 1. Isolation loss detector 202 comprises an ILD capacitor 206 having a first terminal coupled to the positive bus 146 and a second terminal coupled to a first terminal of AC GENERATOR 204. A second terminal of AC GENERATOR 204 is coupled to a first primary terminal of transformer 208. The second primary terminal of transformer 208 is coupled to earth ground. A third secondary terminal of transformer 208 is coupled to a first terminal of resistor 218 and to a first input terminal of LOW-PASS FILTER 210, and a fourth secondary terminal of transformer 208 is coupled to a second terminal of resistor 218 and to a second input terminal of LOW-PASS FILTER 210. A third output terminal of LOW-PASS FILTER 210 is coupled to SYNCHRONOUS RECTIFIER 212, which has a second terminal coupled to a first terminal of INTEGRATOR 214. A second terminal of INTEGRATOR 214 is coupled to a first terminal of COMPARATOR 216. A second terminal of COMPARATOR 216 is coupled to a voltage REF1. A third terminal of COMPARATOR 216 is coupled to an ISOLATION FAULT output.

In operation, a periodic signal such as a sine wave of controlled amplitude is generated by AC GENERATOR 204. In a preferred embodiment of the invention, the frequency of this sine signal is substantially equal to 480 Hz. The negative terminal of this AC GENERATOR 204 is coupled to earth ground through the primary of transformer 208, which presents a low impedance between the negative terminal of AC GENERATOR 204 and earth ground. Because of this low impedance, the negative terminal of the AC GENERATOR 204 is substantially electrically coupled to earth ground. The positive terminal of the AC GENERATOR 204 is coupled through Isolation Loss Detection (ILD) capacitor 206 to the positive bus 146. In normal POE operation without isolation loss, there is little or no AC current flow in the series connected transformer 208, AC GENERATOR 204, and ILD a 206, because there is no return path to earth ground from positive supply bus 146. When a short occurs causing an isolation loss, however, a return path is provided, causing AC current to flow in transformer 208, AC GENERATOR 204, and ILD capacitor 206.

The transformer 208 converts this current flow in its primary to a voltage across resistor 218 coupled to its secondary, which voltage across resistor 218 is responsive to the amplitude of the current flowing in the primary. The AC voltage across resistor 218 is then filtered by LOW-PASS FILTER 210 and rectified by SYNCHRONOUS RECTIFIER 212 to convert the AC signal to a DC voltage responsive to the amplitude of the AC signal. The rectified signal is then further filtered by INTEGRATOR 214, and the filtered voltage is compared in COMPARATOR 216 with a reference voltage REF1.

For the normal condition with no isolation loss, the filtered voltage is less than REF1, and the output of COMPARATOR 216 coupled to the ISOLATION FAULT terminal is in a state indicative of no fault. When an isolation loss occurs, the filtered voltage exceeds threshold REF1, and the COMPARATOR 216 output changes state indicative of and isolation fault.

Figure 3:
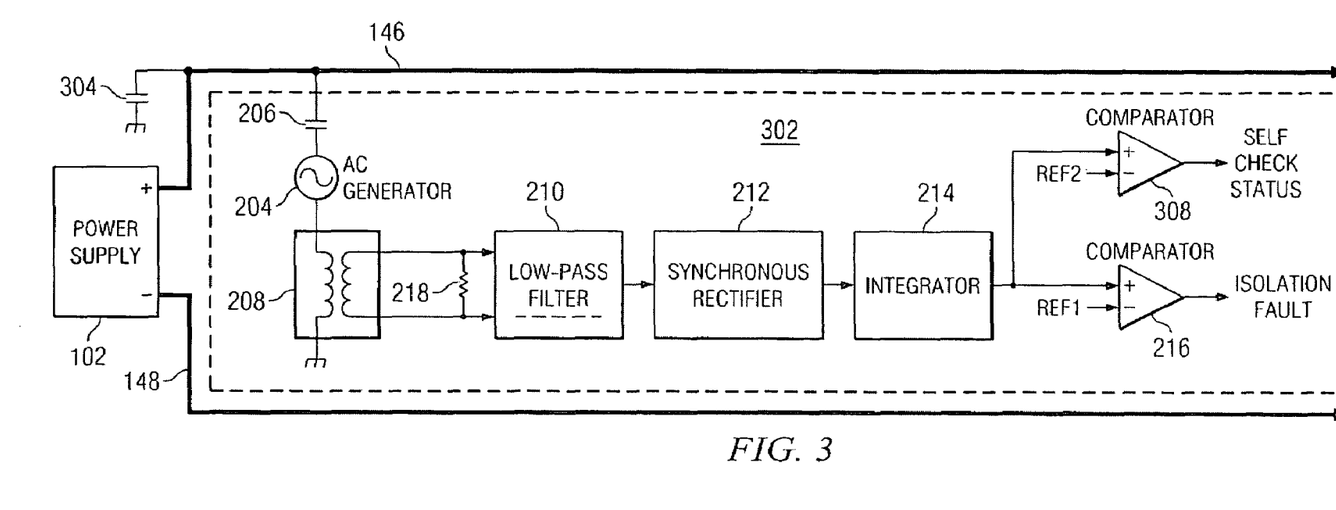
FIG. 3 is a block diagram of a system like that of FIG. 2, with the addition of bypass capacitors from the POE positive and or negative supply conductors to earth ground, which cause a nominal AC current flow which is compared, in a second comparator, to a second threshold, providing a self-test of the isolation loss detection circuitry.

In FIG. 3, a POE system substantially similar to that of FIG. 2 comprises POWER SUPPLY 102, positive bus 146, and negative bus 148, which are coupled in a known manner to the known POE system shown in FIG. 1. Isolation loss detector 302 comprises an ILD capacitor 206 having a first terminal coupled to the positive bus 146 and a second terminal coupled to a first terminal of AC GENERATOR 204. A second terminal of AC GENERATOR 204 is coupled to a first primary terminal of transformer 208. The second primary terminal of transformer 208 is coupled to earth ground. A third secondary terminal of transformer 208 is coupled to a first terminal of resistor 218 and to a first input terminal of LOW-PASS FILTER 210, and a fourth secondary terminal of transformer 208 is coupled to a second terminal of resistor 218 and to a second input terminal of LOW-PASS FILTER 210. A third output terminal of LOW-PASS FILTER 210 is coupled to SYNCHRONOUS RECTIFIER 212, which has a second terminal coupled to a first terminal of INTEGRATOR 214. A second terminal of INTEGRATOR 214 is coupled to a first terminal of COMPARATOR 216. A second terminal of COMPARATOR 216 is coupled to a voltage REF1. A third terminal of COMPARATOR 216 is coupled to an ISOLATION FAULT output.

In addition, distributed capacitance 304 has a first terminal coupled to the positive bus 146 and a second terminal coupled to earth ground. This distributed capacitance is typically added to the system to reduce electromagnetic interference (EMI) generated by or coupled into the system. Because the impedance of the POWER SUPPLY 102 is low at the operating frequency of the isolation loss detector, distributed capacitance on both power buses 146 and 148 appears in parallel and will be represented by distributed capacitance 304. A second COMPARATOR 308 has a first terminal coupled to the output of INTEGRATOR 214 and to the first terminal of COMPARATOR 216, a second terminal coupled to reference voltage REF2, and a third terminal coupled to a SELF CHECK STATUS output terminal.

In operation and under normal conditions with substantially no isolation loss, a nominal current from AC GENERATOR 204 flows through ILD capacitance 206 and distributed capacitance 304 to earth ground. The amplitude of this current depends on the impedance of this path at the frequency of AC GENERATOR 204. For example, if the capacitance 304 is substantially equal to the ILD capacitance 206, a nominal current of Iac will flow in the absence of isolation loss. If a short to earth ground occurs from bus 146, bus 148, or any conductor connected thereto, the distributed capacitance 304 will effectively be shorted, causing the current flow in ILD capacitor 206 to substantially double.

As in the embodiment described in FIG. 2, the current flow through ILD capacitor 206 is converted to a voltage responsive to the current, and this voltage is then filtered, rectified, and compared to a threshold REF1 in COMPARATOR 216, providing an indication of isolation fault when the current exceeds the threshold represented by REF1. A second threshold REF2 is compared to the filtered and rectified AC voltage in COMPARATOR 308. The nominal voltage from INTEGRATOR 214, under normal conditions of no isolation loss, is above this threshold REF2 due to the AC current flow through the distributed capacitance 304, and the output of COMPARATOR 308 is indicative of normal operation of the isolation loss detector. If a portion of the isolation loss detection circuitry should fail, causing the output of INTEGRATOR 214 to drop below threshold REF2, the output of COMPARATOR 308 changes state to indicate a self check failure.

Figure 4:
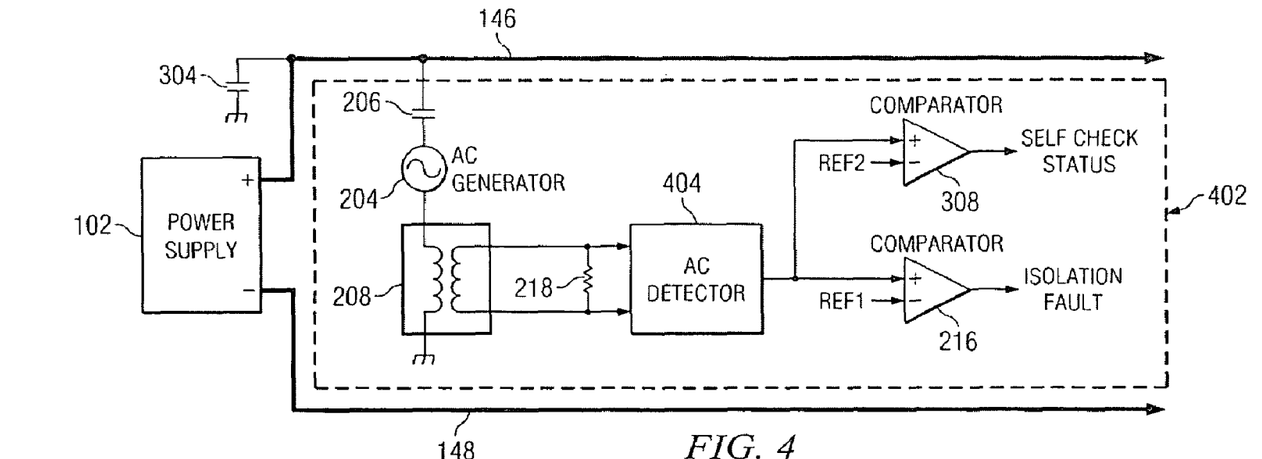
FIG. 4 is a block diagram of a system like that of FIG. 3, having an alternative AC detector in place of the synchronous rectifier shown in FIG. 3.

In FIG. 4, an alternate AC DETECTOR 404 replaces LOW-PASS FILTER 210, SYNCHRONOUS RECTIFIER 212, and INTEGRATOR 214 of FIG. 3. Isolation loss detector 402 comprises an ILD capacitor 206 having a first terminal coupled to the positive bus 146 and a second terminal coupled to a first terminal of AC GENERATOR 204. A second terminal of AC GENERATOR 204 is coupled to a first primary terminal of transformer 208. The second primary terminal of transformer 208 is coupled to earth ground. A third secondary terminal of transformer 208 is coupled to a first terminal of resistor 218 and to a first input terminal of AC DETECTOR 404, and a fourth secondary terminal of transformer 208 is coupled to a second terminal of resistor 218 and to a second input terminal of AC DETECTOR 404. A third output terminal of AC DETECTOR 404 is coupled to a first terminal of COMPARATOR 216 and a first terminal of COMPARATOR 308. A second terminal of COMPARATOR 216 is coupled to a voltage REF1. A third terminal of COMPARATOR 216 is coupled to an ISOLATION FAULT output terminal. COMPARATOR 308 has a second terminal coupled to reference voltage REF2, and a third terminal coupled to a SELF CHECK STATUS output terminal. Distributed capacitance 304 has a first terminal coupled to the positive bus 146 and a second terminal coupled to earth ground. Operation is substantially equivalent to the operation of the circuit shown in FIG. 3. Those skilled in the art will recognize many alternative known AC detection circuits may be used in the embodiment described.

Figure 5:
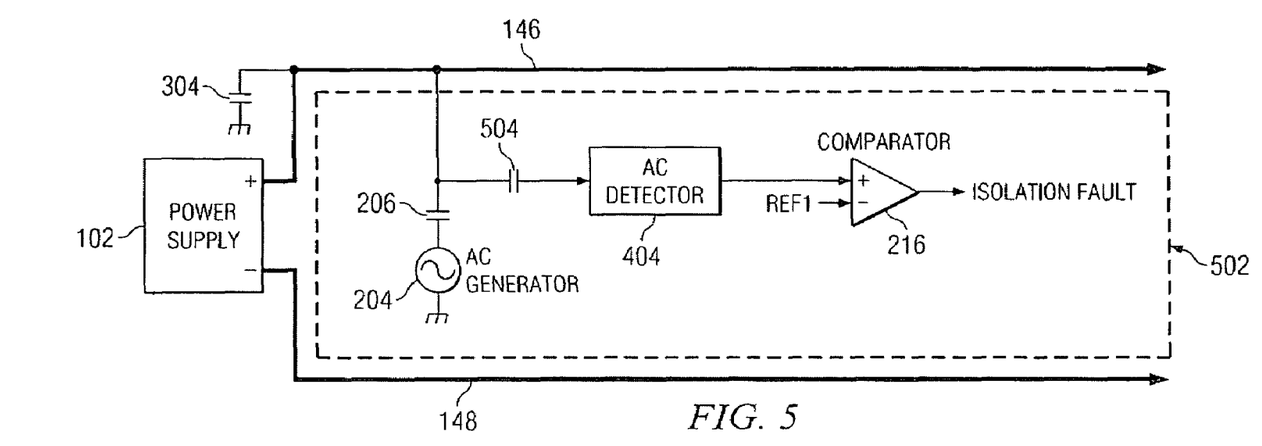
FIG. 5 is a block diagram of system like that of FIG. 4, omitting the current to voltage transformer and directly measuring AC voltage at one side of the Isolation Loss Detection capacitor.

In FIG. 5, yet another embodiment measures the AC voltage present on the positive bus 146. Isolation loss detector 502 comprises an ILD capacitor 206 having a first terminal coupled to the positive bus 146 and to a first terminal of capacitor 504, and a second terminal coupled to a first terminal of AC GENERATOR 204. A second terminal of AC GENERATOR 204 is coupled to earth ground. A second terminal of capacitor 504 is coupled to a first terminal of AC DETECTOR 404. The second terminal of AC DETECTOR 404 is coupled to a first terminal of COMPARATOR 216. A second terminal of COMPARATOR 216 is coupled to a voltage REF1. A third terminal of COMPARATOR 216 is coupled to an ISOLATION FAULT output. Distributed capacitance 304 has a first terminal coupled to the positive bus 146 and a second terminal coupled to earth ground.

In operation and under normal conditions with negligible isolation loss, a nominal voltage from AC GENERATOR 204 is coupled through ILD capacitance 206 to positive bus 146. Distributed capacitance 304 is coupled between positive bus 146 and earth ground. If the impedance of capacitor 504 is high compared to the impedance of ILD capacitor 206, the amplitude of the AC voltage on positive bus 146 is primarily a function of the relative impedance of distributed capacitance 304 and the ILD capacitance 206. For example, if the distributed capacitance 304 is substantially equal to the ILD capacitance 206, a nominal voltage of Vac will be present at the intersection of these two capacitances, in the absence of isolation loss. If a short to earth ground occurs from positive bus 146, negative bus 148, or any conductor connected thereto, the distributed capacitance 304 will effectively be shorted, causing the AC voltage at the intersection of these two capacitances to substantially decrease. The AC voltage on positive bus 146 is coupled through capacitor 504 to AC DETECTOR 404. The output of this detector is coupled to COMPARATOR 216, and the threshold REF1 is set appropriately to differentiate between a normal state and one of isolation loss. The ISOLATION FAULT output of COMPARATOR 216 is thus indicative of isolation loss.

In an embodiment substantially equivalent to that shown in FIG. 5, but having no distributed capacitance 304, the circuit of FIG. 5 operates substantially the same as with such distributed capacitance. In the absence of isolation loss, the AC voltage present on the POE buses and conductors coupled to these buses is substantially equal to the AC voltage developed by AC GENERATOR 204. In the presence of a short to earth ground as described above, the AC voltage on the positive bus is significantly reduced, causing a change of state of COMPARATOR 216.

Figure 6:
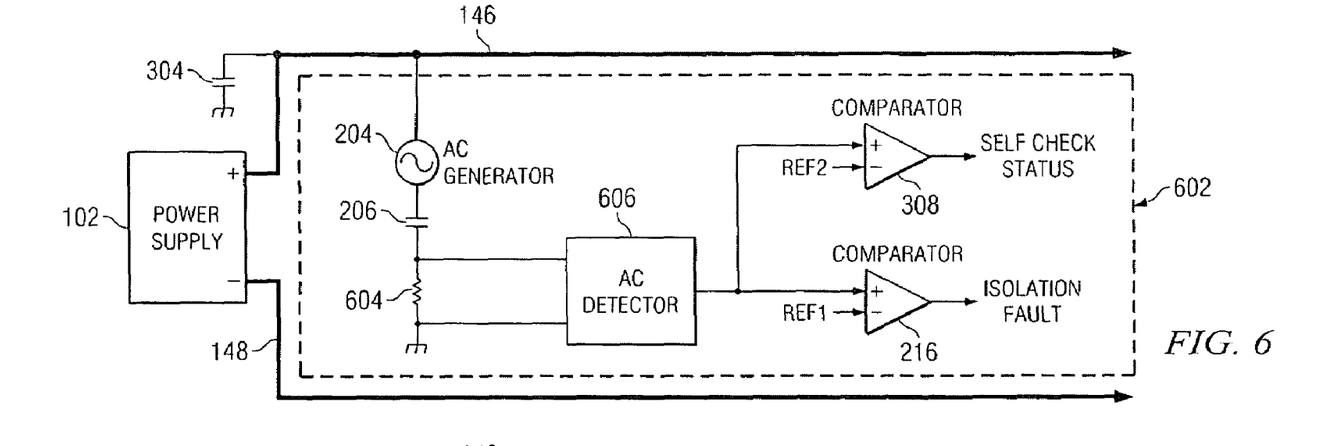
FIG. 6 is a block diagram of a system like that of FIG. 4, omitting the transformer and measuring the differential AC voltage developed across a sense resistor by current flowing in the ILD capacitor.

In FIG. 6, ILD 602 shows yet another embodiment of ILD which utilizes a resistor 604 to convert the AC current flow through ILD capacitor 206 to a differential AC voltage. AC GENERATOR 204 has a first terminal coupled to the positive bus 146 and a second terminal coupled to a first terminal of ILD capacitor 206. A second terminal of ILD capacitor 206 is coupled to a first terminal of resistor 604 and to a first input terminal of AC DETECTOR 606. A second terminal of resistor 604 is coupled to a second input terminal of AC DETECTOR 606 and to earth ground. A third output terminal of AC DETECTOR 606 is coupled to a first input terminal of COMPARATOR 308 and a first input terminal of COMPARATOR 216. A second input terminal of COMPARATOR 216 is coupled to a voltage REF1, and a third output terminal of COMPARATOR 216 is coupled to an ISOLATION FAULT terminal. A second input terminal of COMPARATOR 308 is coupled to a voltage REF2, and a third output terminal of COMPARATOR 308 is coupled to a SELF CHECK STATUS terminal. Distributed capacitor 304 has a first terminal coupled to the positive bus 146 and a second terminal coupled to earth ground.

In operation, a differential AC voltage is developed across resistor 604 by the AC current flowing through it. The input impedance of the first and second terminals of AC DETECTOR 606 is high compared to the value of resistor 604, thereby causing the voltage across resistor 604 to be substantially proportional to the current flow though it. This differential voltage across resistor 604 is coupled to the first and second terminals of AC DETECTOR 606, which causes a DC voltage to be generated at the output of AC DETECTOR 606 which is substantially proportional to the AC current flow through ILD capacitor 206. As described above, this DC output is compared, in COMPARATOR 216 and COMPARATOR 308, respectively, to thresholds REF1 and REF2 to create ISOLATION FAULT and SELF CHECK STATUS indications at the outputs of COMPARATOR 216 and COMPARATOR 308, respectively.

Figure 7:
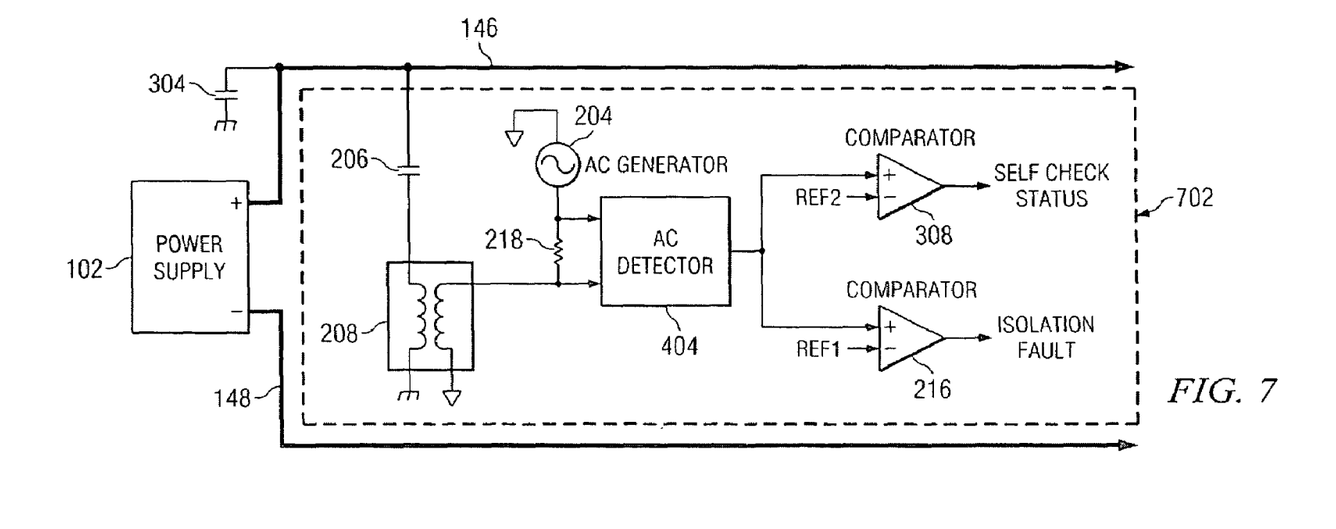
FIG. 7 is a block diagram of an isolation loss detector which couples the primary of a transformer through an ILD capacitor to the POE conductors to be monitored, injects an AC signal through a sense resistor and the secondary of the transformer, and compares the amplitude of the AC voltage across the sense resistor to a known threshold, so as to monitor isolation between POE conductors and earth ground.

In FIG. 7, an alternative circuit topology to FIG. 4 allows the AC GENERATOR 204 and current sense resistor 218 to function in a manner substantially equivalent to that of FIG. 4 but without a connection to earth ground. Isolation loss detector 702 comprises an ILD capacitor 206 having a first terminal coupled to the positive bus 146 and a second terminal coupled to a first primary terminal of transformer 208. The second primary terminal of transformer 208 is coupled to earth ground. A first terminal of AC GENERATOR 204 is coupled to local system ground. A second terminal of AC GENERATOR 204 is coupled to a first terminal of resistor 218 and to a first input terminal of AC DETECTOR 404. A second terminal of resistor 218 is coupled to a third secondary terminal of transformer 208 and to a second input terminal of AC DETECTOR 404. A fourth secondary terminal of transformer 208 is coupled to local system ground. A third output terminal of AC DETECTOR 404 is coupled to a first terminal of COMPARATOR 216 and a first terminal of COMPARATOR 308. A second terminal of COMPARATOR 216 is coupled to a voltage REF1. A third terminal of COMPARATOR 216 is coupled to an ISOLATION FAULT output terminal. COMPARATOR 308 has a second terminal coupled to reference voltage REF2, and a third terminal coupled to a SELF CHECK STATUS output terminal. Distributed capacitance 304 has a first terminal coupled to the positive bus 146 and a second terminal coupled to earth ground.

In operation, the AC voltage across resistor 218 is responsive to the AC impedance presented by the secondary of transformer 208. This impedance is responsive to the AC impedance between the positive bus 146 and the negative bus 148. In normal operation, the impedance is substantially equal to that impedance attributable to capacitor 304. In a fault condition such as a short between the positive bus 146 and the negative bus 148, the impedance at the secondary of transformer 208 decreases significantly. As in the circuit described in FIG. 4, the AC current flowing through resistor 218, and hence the AC voltage developed across it, is thus responsive to the presence or absence of an isolation fault. The AC voltage across resistor 218 is detected by AC DETECTOR 404, and as described above for FIG. 4, the output voltage from AC DETECTOR 404 is compared to thresholds to generate ISOLATION FAULT and SELF CHECK STATUS outputs. Those skilled in the art will recognize many alternative known AC detection circuits may be used in the embodiment described, and that the placement of AC GENERATOR 204 and resistor 218 in series with the secondary of transformer 208 as shown in FIG. 7 may also be applied to the circuits of FIG. 2 or FIG. 3. It will also be obvious that the order of connection of the series connected ILD capacitor 206 and transformer 208 primary, or the order of connection of the series connected AC GENERATOR 204, resistor 218, and transformer 208 secondary, may be changed with substantially equivalent results.

Those skilled in the art to which the invention relates will also appreciate that yet other substitutions and modifications can be made to the described embodiments, without departing from the spirit and scope of the invention as described by the claims below. For example, the invention is not limited to a POE system, but is also generally applicable to digital communications systems that also provide power. In addition, the AC GENERATOR need not be sinusoidal, and may be at a wide variety of frequencies and amplitudes. The transformer 208 may alternatively be a different current to voltage converter, or may be eliminated if the circuitry following it is designed to process signal currents rather than signal voltages. The amount, if any, of low-pass filtering of the signal may be varied widely. Rectification of the AC signal may be done in a number of ways, including synchronous rectification (straightforward because the AC GENERATOR is co-located), diode detection, or others. Integration to further filter the rectified signal may not be necessary in some applications. Grounding of the isolation loss detector circuitry may be to earth ground or to the negative supply bus of the PSE, as long as suitable isolation is maintained between the negative terminal of the AC GENERATOR, which is connected to earth ground, and the rest of the circuitry. While the preferred embodiment describes measurement of a current which increases when isolation loss occurs, an alternative embodiment might monitor the level of an AC voltage applied to the POE positive bus, sensing a voltage drop that occurs when isolation loss is present. The AC signal may be injected at various points in the POE system, including the positive or negative buses or substantially any conductor coupled to the positive or negative buses through a low impedance path, such as one conductor of a wire pair carrying POE current, or POE supply conductors within Powered Devices. While comparators shown in the drawings herein show a specific connection of positive and negative inputs, these inputs may be reversed as desired to control the positive or negative sense of the comparator outputs.

Many other alternatives to the circuits and sub circuits described are possible while retaining the scope and spirit of the invention.

What is claimed is:

1. An apparatus for measuring electrical isolation between a plurality of POE (Power-Over-Ethernet) conductors in a POE system and earth ground, the apparatus comprising:
    an alternating current (AC) generator having a first terminal and a second terminal;
    a capacitor having a first terminal coupled to at least one of the POE conductors which normally has high isolation from earth ground and having a second terminal coupled to the first terminal the AC generator;
    a current-to-voltage converter having a first terminal coupled to the second terminal of the AC generator having a second terminal coupled to earth ground, and having a third terminal for providing an AC voltage representative of the AC current flowing in the series connected AC generator, capacitor, and current-to-voltage converter;
    an AC detector having a first terminal coupled to the third terminal of the current-to-voltage converter and having a second terminal for providing a direct current (DC) voltage representative of the AC current flowing in the series connected AC generator, capacitor, and current-to-voltage converter; and
    a comparator having a first terminal coupled to the second terminal of the AC detector, having a second terminal coupled to a reference voltage source, and having a third terminal, wherein the comparator is adapted to change a voltage state of the third terminal as the voltage at the first terminal of the comparator goes above and below the reference voltage at the second terminal of the comparator, and wherein, in a condition of high isolation between the POE conductors and earth ground, the AC current flow in the series connected AC generator, capacitor, and current-to-voltage converter is below the comparison threshold set by the reference voltage such that the comparator output is indicative of high isolation and wherein, in a condition of reduced isolation between the POE conductor and earth ground, the AC current flow in the series connected AC generator, capacitor, and current-to-voltage converter is above the comparison threshold set by the reference voltage such that the comparator output is indicative of isolation loss.

2. The apparatus of claim 1, wherein the current-to-voltage converter is a transformer.

3. The apparatus of claim 1, wherein the current-to-voltage converter is a resistor.

4. The apparatus of claim 1, wherein the apparatus further comprises a second comparator having a first terminal coupled to the second terminal of the AC detector, having a second terminal coupled to a second reference voltage, and having a third terminal, wherein the second comparator is adapted to change a voltage state of the third terminal as the voltage at the first terminal of the second comparator goes above and below a second reference voltage at the second terminal of the second comparator, wherein the amplitude of the detected AC voltage is compared to the threshold of the second comparator to monitor operational condition of the isolation loss detector circuitry.

5. The apparatus of claim 1, wherein the apparatus further comprises:
    a low-pass filter having a first terminal coupled to the third terminal of the current-to-voltage converter and a second terminal; and
    a synchronous rectifier having a first terminal coupled to a second terminal of the low-pass filter, wherein the AC voltage present at the output of the current-to-voltage converter is filtered to reduce interference, then converted to a DC voltage by synchronous rectification, and wherein the filtered and rectified signal is compared with a threshold voltage to determine if isolation loss has occurred.

6. The apparatus of claim 5, wherein the apparatus further comprises an integrator which averages the amplitude of the rectified voltage over many cycles of the AC generator, wherein interference from other AC signals at lower frequencies than the frequency of the AC generator is reduced.

7. An apparatus for measuring electrical isolation between a plurality of POE (Power-Over-Ethernet) conductors in a POE system and earth ground, the apparatus comprising:
    an AC generator having a first terminal and a second terminal;
    a first capacitor having a first terminal coupled to at least one of the POE conductors which normally has high isolation from earth ground and having a second terminal coupled to the first terminal of the AC generator;
    a second capacitor having a first terminal coupled to the first terminal of the first capacitor and to the POE conductor;
    an AC detector having a first terminal coupled to the second terminal of the second capacitor and having a second terminal for providing a DC voltage representative of the AC voltage present on the POE conductor; and
    a comparator having a first terminal coupled to the second terminal of the AC detector, having a second terminal coupled to a reference voltage, and having a third terminal, wherein the comparator is adapted to change a voltage state of the third terminal as the voltage at the first terminal of the comparator goes above and below the reference voltage at the second terminal of the comparator, and wherein, in a condition of high isolation between the POE conductors and earth ground, the AC voltage present at the first terminal of the AC detector causes a DC voltage at the second terminal of the AC detector which is above the comparison threshold set by the reference voltage such that the comparator output is indicative of high isolation and wherein in a condition of reduced isolation between the POE conductor and earth ground, the AC voltage present at the first terminal of the AC detector causes a DC voltage at the second terminal of the AC detector which is below the comparison threshold set by the reference voltage such that the comparator output is indicative of isolation loss.

8. The apparatus of claim 7, wherein the apparatus further comprises:
    a low-pass filter having a first terminal coupled to the second terminal of the second capacitor; and
    a synchronous rectifier having a first terminal coupled to a second terminal of the low-pass filter, wherein the AC voltage present at the second terminal of the second capacitor is filtered to reduce interference, then converted to a DC voltage by synchronous rectification, and wherein the filtered and rectified signal is compared with a threshold voltage to determine if isolation loss has occurred.

9. The apparatus of claim 8, wherein the apparatus further comprises an integrator which averages the amplitude of the rectified voltage over many cycles of the AC generator, wherein interference from other AC signals at lower frequencies than the frequency of the AC generator is reduced.

10. A method for measuring electrical isolation between a plurality of conductors in a POE (Power-Over-Ethernet) system and earth ground, the method comprising:
   injecting an alternating current into at least one of the conductors in the POE system, which current flows between earth ground and the at least one conductor in the POE system;
   measuring the amplitude of the injected current;
   comparing the amplitude of the injected current to a first reference threshold, wherein, under normal conditions of negligible isolation loss between the at least one conductor of the POE system and earth ground, the amplitude of the injected current is less than the first reference threshold, and in conditions of isolation loss, the injected current is greater than the first reference threshold, and wherein the state of the comparison is indicative of isolation loss.

11. The method of claim 10, wherein the method further comprises:
   coupling bypass capacitance between the at least one conductor in the POE system and earth ground; and
   comparing the amplitude of the injected current to another reference threshold which is lower than the first reference threshold, wherein, under normal conditions of negligible isolation loss but of increased flow of the injected alternating current caused by the bypass capacitance from the at least one conductor in the POE system to earth ground, the amplitude of the injected current is greater than a second reference threshold such that the state of the comparison to the second another reference threshold is indicative of proper operation of the isolation loss detection circuitry and wherein a decrease of the injected current below the second reference threshold is indicative of a failure of the isolation loss detection circuitry.

12. The method of claim 10, wherein the step of measuring the amplitude of the injected current further comprises:
   converting a sample of the injected current to an AC voltage proportional to the injected current;
   synchronously rectifying the AC voltage proportional to the injected current by commutating the AC voltage signal with a switching signal coupled from the generator of the injected current, the switching signal having the same frequency and a stable phase compared to the AC voltage proportional to the injected current; and
   integrating over a time period the rectified output of the synchronously rectifying the AC voltage step, wherein a DC voltage responsive to the amplitude of the injected current is generated, and wherein noise on the injected current is rejected.

13. An apparatus for measuring electrical isolation between a plurality of POE (Power-Over-Ethernet) conductors in a POE system and earth ground, the apparatus comprising:
   a transformer having primary and secondary windings, having a first primary terminal, having a second primary terminal coupled to earth ground, having a third secondary terminal, and having a fourth secondary terminal coupled to local system ground;
   a capacitor having a first terminal coupled to at least one of the POE conductors which normally has high isolation from earth ground and having a second terminal coupled to the first primary terminal of the transformer;
   an AC generator having a first terminal coupled to local system ground and having a second terminal coupled to a first terminal of a resistor;
   a second terminal of the resistor coupled to the third secondary terminal of the transformer;
   an AC detector having a first terminal coupled to the second terminal of the AC generator and the first terminal of the resistor, having a second terminal coupled to the second terminal of the resistor and the third secondary terminal of the transformer, and having a third output terminal upon which is present a DC voltage representative of the AC current flowing in the series connected AC generator, resistor and transformer secondary; and
   a comparator having a first terminal coupled to the third output terminal of the AC detector, having a second terminal coupled to a reference voltage, and having a third terminal which changes voltage state as the voltage at the first terminal of the comparator goes above and below the reference voltage at the second terminal of the comparator, wherein, in a condition of high isolation between the POE conductors and earth ground, the impedance across the secondary winding of the transformer is relatively high, being responsive to the impedance across the primary winding of the transformer, causing a relatively low AC current to flow in the resistor and further causing the output of the AC detector to be below the comparison threshold set by the reference voltage such that the comparator output is indicative of high isolation, and wherein, in a condition of reduced isolation between the POE conductors and earth ground, the impedance across the secondary winding of the transformer is relatively low, being responsive to the impedance across the primary winding of the transformer, causing a relatively high AC current to flow in the resistor and further causing the output of the AC detector to be above the comparison threshold set by the reference voltage such that the comparator output is indicative of low isolation.

14. A method for measuring electrical isolation between a plurality of conductors in a POE (Power-Over-Ethernet) system and earth ground, comprising the steps:
   coupling a first terminal of the primary of a transformer through a capacitor to conductors of the POE system,
   coupling a second terminal of the primary of the transformer to earth ground, wherein the impedance of the secondary of the transformer is responsive to the impedance between at least one of the conductors of the POE system and earth ground;
   coupling an AC signal through a series connection of the secondary of the transformer and a series resistor;
   measuring the amplitude of the resulting AC voltage across the resistor;
   comparing the amplitude of the AC voltage to a reference threshold, wherein, under normal conditions of negligible isolation loss between the at least one conductor of the POE system and the earth ground, the amplitude of the AC voltage is less than the reference threshold, and in conditions of isolation loss, the AC voltage is greater than the first reference threshold, and wherein the state of the comparison is indicative of isolation loss.

* * * * *